(12) United States Patent
Zhao et al.

(10) Patent No.: US 9,368,497 B2
(45) Date of Patent: Jun. 14, 2016

(54) FIN FIELD-EFFECT TRANSISTORS AND FABRICATION METHOD THEREOF

(71) Applicant: Semiconductor Manufacturing International (Shanghai) Corporation, Shanghai (CN)

(72) Inventors: Jie Zhao, Shanghai (CN); Yizhi Zeng, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/722,671

(22) Filed: May 27, 2015

(65) Prior Publication Data
US 2015/0348966 A1   Dec. 3, 2015

(30) Foreign Application Priority Data

May 30, 2014   (CN) .......................... 2014 1 0240693

(51) Int. Cl.
| | |
|---|---|
| H01L 21/02 | (2006.01) |
| H01L 21/3105 | (2006.01) |
| H01L 27/088 | (2006.01) |
| H01L 21/8234 | (2006.01) |
| H01L 29/66 | (2006.01) |
| H01L 21/3213 | (2006.01) |
| H01L 21/306 | (2006.01) |
| H01L 29/49 | (2006.01) |
| H01L 29/51 | (2006.01) |

(52) U.S. Cl.
CPC ...... *H01L 27/0886* (2013.01); *H01L 21/02164* (2013.01); *H01L 21/02219* (2013.01); *H01L 21/02222* (2013.01); *H01L 21/02255* (2013.01); *H01L 21/02271* (2013.01); *H01L 21/30604* (2013.01); *H01L 21/3105* (2013.01); *H01L 21/31053* (2013.01); *H01L 21/32134* (2013.01); *H01L 21/823431* (2013.01); *H01L 21/823437* (2013.01); *H01L 29/495* (2013.01); *H01L 29/4966* (2013.01); *H01L 29/517* (2013.01); *H01L 29/6681* (2013.01)

(58) Field of Classification Search
CPC ...................... H01L 27/0886; H01L 21/02219; H01L 21/02255; H01L 21/31053
See application file for complete search history.

(56) References Cited

U.S. PATENT DOCUMENTS

| | | | | |
|---|---|---|---|---|
| 3,252,284 | A * | 5/1966 | Von Thuengen | F16H 39/06 418/138 |
| 4,996,574 | A * | 2/1991 | Shirasaki | H01L 29/42376 257/347 |
| 6,770,516 | B2 * | 8/2004 | Wu | H01L 21/84 257/24 |

(Continued)

*Primary Examiner* — Thanh V Pham
(74) *Attorney, Agent, or Firm* — Anova Law Group, PLLC

(57) ABSTRACT

A method for fabricating fin field-effect transistors includes providing a semiconductor substrate; and forming a plurality of fins on a surface of the semiconductor substrate. The method also includes forming dummy gates formed over side and top surfaces of the fins; forming a precursor material layer with a surface higher than top surfaces of the fins to cover the dummy gates and the semiconductor substrate; performing a thermal annealing process to convert the precursor material layer into a dielectric layer having a plurality of voids; and planarizing the dielectric layer to expose the top surfaces of the dummy gates. Further, the method also includes performing a post-treatment process using oxygen-contained de-ionized water on the planarized dielectric layer to eliminate the plurality of voids formed in the dielectric layer; removing the dummy gates to form trenches; and forming a high-K metal gate structure in each of the trenches.

15 Claims, 7 Drawing Sheets

(56) References Cited

U.S. PATENT DOCUMENTS 8,420,459 B1 * 4/2013 Cheng ............... H01L 29/66477
257/E21.32

2009/0302372 A1 * 12/2009 Chang ............... H01L 29/66545
257/327
2013/0078778 A1 * 3/2013 Chien ............... H01L 29/66795
438/296

* cited by examiner

FIN FIELD-EFFECT TRANSISTORS AND FABRICATION METHOD THEREOF

CROSS-REFERENCES TO RELATED APPLICATIONS

This application claims the priority of Chinese patent application No. 201410240693.1, filed on May 30, 2014, the entirety of which is incorporated herein by reference.

FIELD OF THE INVENTION

The present invention generally relates to the field of semiconductor manufacturing technology and, more particularly, relates to fin field-effect transistors (FinFETs) and fabrication processes thereof.

BACKGROUND

With the continuous development of the semiconductor technology, the technical node of the semiconductor process has become smaller and smaller. In order to obtain a desired threshold voltage and to improve the performance of devices, the gate-last process has been widely used. However, when the critical dimension (CD) of the semiconductor devices is further reduced, the structures of the conventional MOS field-effect transistors (MOSFETs) are unable to match the performance requirements even the gate-last process is used to form the MOSFETs. Thus, Fin Field-Effect transistors (Fin FETs), a substitution of the conventional MOSFETs, have attracted extensive attentions.

FIG. 1 illustrates a FinFET formed by an existing fabrication process. As shown in FIG. 1, the FinFET includes a semiconductor substrate 10 and a protruding fin 14 formed on the semiconductor substrate 10. The fin 14 is usually formed by etching the semiconductor substrate 10. The FinFET also includes an isolation layer 11 covering the surface of the semiconductor substrate 10 and a portion of the side surfaces of the fin 14. Further, the FinFET includes a gate structure 12 stretching over the fin 14 and covering the top surface of the fin 14 and the side surfaces of the fin 14. The gate structure 12 includes a gate dielectric layer 15 and a gate electrode 16 formed on the gate dielectric layer 15.

The gate dielectric layer 15 is made of silicon oxide; and the gate electrode 16 is often made of polysilicon. When the CD of the FinFETs is continuously reduced with the development of the semiconductor technology, in order to lower the parasitic capacitance; reduce the leakage current; and increase the device speed, high-K metal gate (HKMG) structures have been adapted into the FinFETs to substitute the conventional gate structure. The HKMG structure is a stacked gate structure having a high dielectric constant (high-K) gate dielectric layer and a metal gate. In order to prevent the metal material of the metal gate from affecting the properties of other structures of the FinFETs, the HKMG structure is usually formed by a gate-last process.

An existing gate-last process for forming FinFETs with the HKMG structures includes providing a semiconductor substrate; and forming a plurality of fins on the semiconductor substrate. The process also includes forming dummy gates on the surfaces of the fins; and forming a dielectric layer to cover the dummy gates, the fins, and the surface of the semiconductor substrate. The surface of the dielectric layer is higher than the surface of the top surfaces of the dummy gates. Further, the process includes planarizing the dielectric layer by a chemical mechanical polishing (CMP) process until the top surface of the dummy gate is exposed; and removing the dummy gates to form openings exposing portions of the top surfaces and side surfaces of the fin. Further, the process also includes forming a high-K dielectric layer in the openings and the forming a metal gate on the high-K dielectric layer.

However, when using such process, it may be easy to form void defects in the dielectric layer. Thus, the electrical insulating characteristic of the dielectric layer may be significantly affected. The disclosed device structures and methods are directed to solve one or more problems set forth above and other problems.

BRIEF SUMMARY OF THE DISCLOSURE

One aspect of the present disclosure includes a method for fabricating fin field-effect transistors. The method includes providing a semiconductor substrate; and forming a plurality of fins on a surface of the semiconductor substrate. The method also includes forming dummy gates over side and top surfaces of the fins; and forming a precursor material layer with a surface higher than the top surfaces of the fins to cover the dummy gates and semiconductor substrate. Further, the method includes performing a thermal annealing process on the precursor material layer to convert the precursor material layer into a dielectric layer having a plurality of voids; and planarizing the dielectric layer having the plurality of voids to expose top surfaces of the dummy gates. Further, the method also includes performing a post-treatment process using oxygen-contained de-ionized water on the planarized dielectric layer to eliminate the plurality of voids formed in the dielectric layer; removing the dummy gates to form trenches in the dielectric layer without voids; and forming a high-K metal gate structure in each of the trenches.

Another aspect of the present disclosure includes a semiconductor structure having multiple fin field-effect transistors (FinFETs). The semiconductor structure having multiple FinFETs includes a semiconductor substrate; and a plurality of fins formed on a surface of the substrate. The semiconductor structure having multiple FinFETs also includes an insulation layer with a surface lower than top surfaces of the fins formed on the surface of the semiconductor substrate; and a high-K gate dielectric layer formed over the top surfaces and side surfaces of the fins and the surface of the insulation layer. Further, the semiconductor structure having multiple FinFETs includes a metal gate formed on the high-K gate dielectric layer; and sidewalls formed on side surfaces of the high-K gate dielectric layer. Further, the semiconductor structure having multiple FinFETs also includes a contact etching stop layer formed on the side surfaces of the high-K dielectric layer and the surface of the insulation layer; and a dielectric layer treated by oxygen-contained de-ionized water to eliminate a plurality of voids formed in the dielectric layer formed on the contact etching stop layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
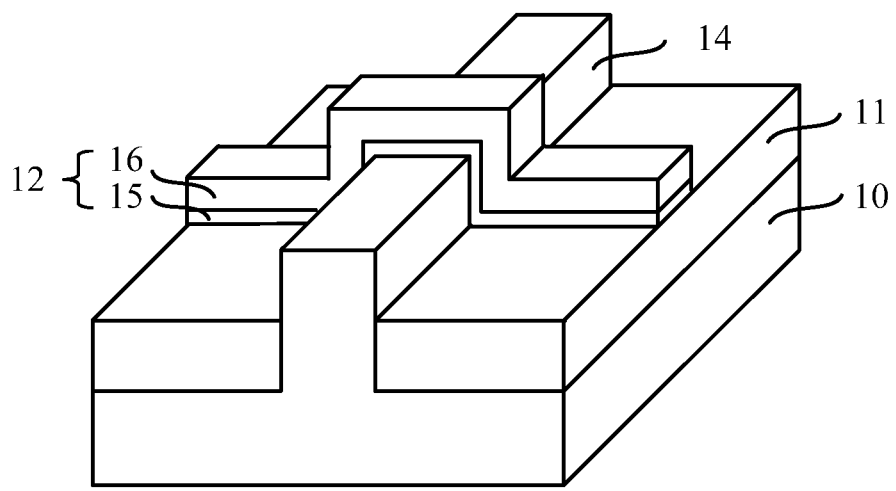
FIG. 1 illustrates an existing FinFET.

Referring to FIG. 1, FinFETs have certain special structures, such as the protruding fins and the gate structures stretching over the fins, etc. Thus, it may be difficult to fill the dielectric material in between adjacent gate structures and adjacent fins when the dielectric layer is formed. In order to increase the gap filling ability of the dielectric material, a flowable chemical vapor deposition (FCVD) process may be used to form the dielectric layer. Specifically, the process for forming the dielectric layer may include forming a precursor material layer to cover the surfaces of the dummy gates, the fins and the semiconductor substrate by an FCVD process; and followed by annealing the precursor material layer to convert the precursor material layer into the dielectric layer. The surface of the precursor material layer may be higher than the surface of the top surfaces of the dummy gates; and the dielectric layer may be made of silicon oxide.

In order to ensure the doping ions in the source/drain regions of the FinFETs not to over-diffuse during the thermal annealing process, the annealing temperature may be relatively low (lower than approximately 700° C.). When the thermal annealing process is being performed, the precursor material layer is being converted into the dielectric layer. Gaseous by-products generated during the thermal annealing process may be able to discharge from the precursor material layer.

However, when the CD of the FinFETs is continually decreased, the distance between adjacent dummy gates on the fins is also continuously reduced. Thus, the depth-to-width ratio of the trenches between adjacent dummy gates has also been continuously increased. When the surface of the precursor material layer between adjacent dummy gates is converted into the dielectric layer, the bottom of the precursor material layer between adjacent dummy gates may not be entirely converted into the dielectric layer. The unconverted precursor material layer may be relatively loose; and there may be many voids inside. Thus, defects, such as voids, etc., may be formed in the finally formed dielectric layer. According to the disclosed methods and device structures, the by-products and the voids issues and other related issues may be solved by treating the dielectric layer by oxygen-contained de-ionized water and/or changing the process sequence.

Figure 18:
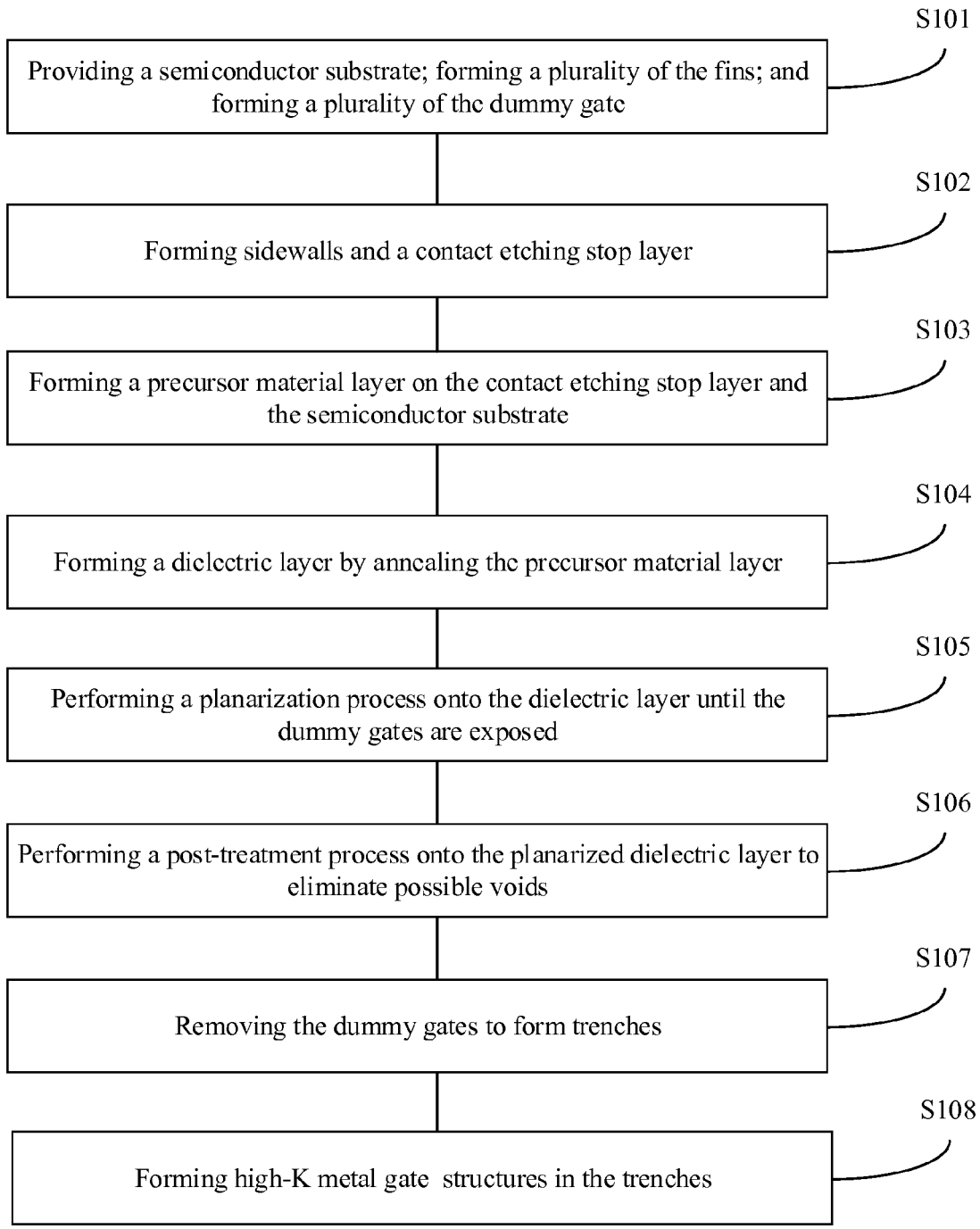
FIG. 18 illustrates an exemplary fabrication method of FinFETs consistent with the disclosed embodiments.

FIG. 18 illustrates an exemplary fabrication method of FinFETs consistent with the disclosed embodiments; and FIGS. 2~13 illustrate semiconductor structures corresponding to certain stages of the exemplary fabrication method of the FinFETs consistent with the disclosed embodiments.

Figure 2:
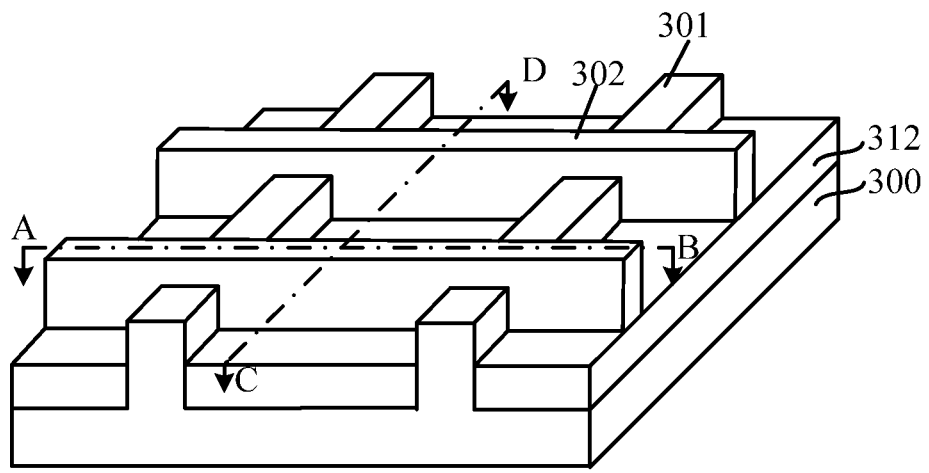
FIGS. 2~13 illustrate semiconductor structures corresponding to certain stages of an exemplary fabrication method of FinFETs.
Figure 3:
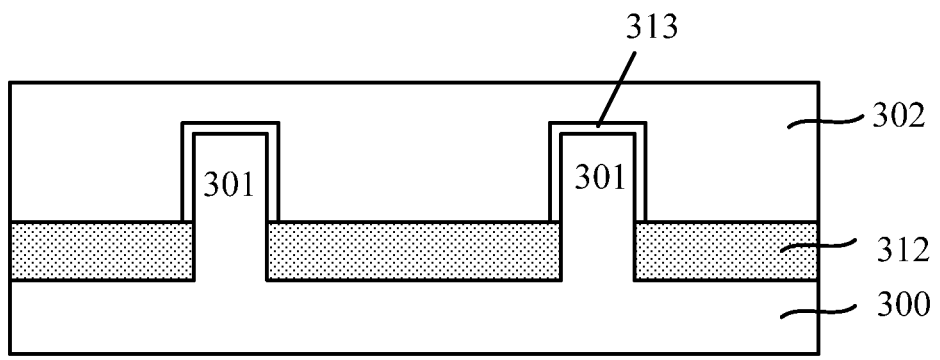
Figure 4:
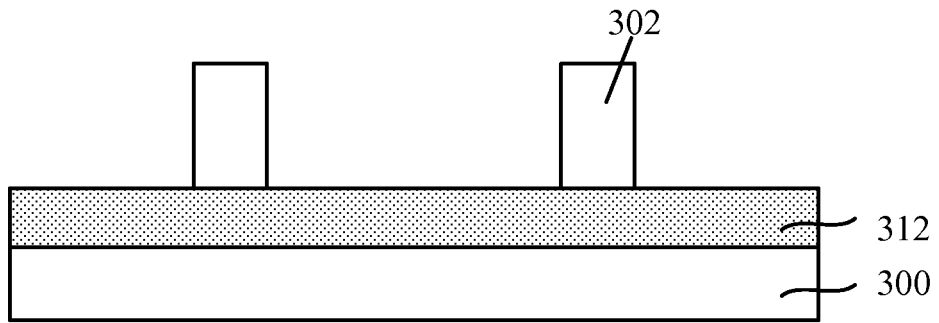

As shown in FIG. 18, at the beginning of the fabrication process, a semiconductor substrate with certain structures is provided (S101). FIGS. 2~4 illustrate a corresponding semiconductor structure; FIG. 3 illustrates a cross-section view of the semiconductor structure shown in FIG. 2 along the "AB" direction; and FIG. 4 illustrates a cross-section view of the semiconductor structure shown in FIG. 2 along the "CD" direction.

As shown in FIG. 2, a semiconductor substrate 300 is provided; and a plurality of fins 301 are formed on semiconductor substrate 300. Further, dummy gate structures 302 stretching over the side surfaces and the top surfaces of the fins 301 are formed.

The semiconductor substrate 300 may include any appropriate semiconductor materials, such as silicon, silicon on insulator (SOI), silicon germanium, germanium on insulator (GOI), carborundum, indium antimonide, lead telluride, indium arsenide, indium phosphide, gallium arsenidie, gallium nitride, gallium antimonite, alloy semiconductor or a combination thereof. In one embodiment, the semiconductor substrate 300 is silicon. The semiconductor substrate 300 provides a base for subsequent processes and structures.

The fins 301 may be formed on the surface of the semiconductor substrate 300; and may protrude from the surface of the semiconductor substrate 300. In one embodiment, the fins 301 may be formed by etching the semiconductor substrate 300 by any appropriate process. In certain other embodiments, the fins 301 may be formed on the surface of the semiconductor substrate 300 by an epitaxial process.

The fins 301 may be doped with appropriate types of ions according to the type of the FinFETs. In one embodiment, the FinFETs are P-type FinFETs, the fins 301 are doped with N-type ions.

Further, as shown in FIG. 2, an insulation layer 312 may be formed on the surface of the semiconductor substrate 300. The top surface of the insulation layer 312 may be lower than the top surfaces of the fins 301. The insulation layer 312 may be used to electrically insulate adjacent fins 301 and adjacent subsequently formed gate structures.

The insulation layer 312 may be made of any appropriate material, such as silicon oxide, silicon nitride, or silicon oxynitride, etc. In one embodiment, the insulation layer 312 is made of silicon oxide.

A process for forming the insulation layer 312 may include sequentially forming an insulation material layer to cover the surface of the semiconductor substrate 300 and the fins 301; planarizing the insulation material layer by a chemical mechanical polishing (CMP) process using the top surfaces of the fins 301 as a polishing stop layer; and performing an etch back process to continuously remove a portion of the insulation material layer to cause the polished surface to be lower than the top surfaces of the fins 301. Thus, the insulation layer 312 may be formed.

Referring to FIG. 2, the dummy gate structures 302 may be formed on the side surfaces and the top surfaces of the fins 301. The dummy gate structures 302 may be subsequently removed to form trenches; and metal gates may be subsequently formed in the trenches.

A plurality of the dummy gate structures 302 may be formed on each of the fins 301. Thus, a plurality of the metal gates may be subsequently formed on each of the fins 301. In one embodiment, the distance between adjacent dummy gate structures 302 may be in a range of approximately 20 nm~200 nm.

In one embodiment, a single dummy gate 302 may stretch over a plurality of the fins 301. In certain other embodiments, the dummy gate 302 may be broken in between different fins 301.

The dummy gates 302 may be made of any appropriate material, such as poly silicon, or metal material, etc. In one embodiment, the dummy gates 302 are made of polysilicon.

A process for forming the dummy gates 302 may include sequentially forming a polysilicon layer (not shown) to cover the fins 301 and the insulation layer 312; planarizing the polysilicon layer by a CMP process; forming a patterned mask layer on the planarized polysilicon layer; and etching the planarized polysilicon layer using the patterned mask layer as an etching mask. Thus, the dummy gates 302 stretching over the side surfaces and the top surfaces of the fins 301 may be formed.

The polysilicon layer may be formed by any appropriate process, such as a chemical vapor deposition (CVD) process, a physical vapor deposition (PVD) process, an atomic layer deposition (ALD) process, or a flowable CVD (FCVD) process, etc. In one embodiment, the polysilicon layer is formed by a CVD process.

Further, as shown in FIG. 3, before forming the dummy gates 302 on the fins 301, an interface oxide layer 313 may be formed on the side surfaces and the top surface of the fins 301. The interface oxide layer 313 may be used as a stop layer for subsequently removing the dummy gates 302; and a protective layer for protecting the fins 301 from being damaged during the process for removing the dummy gates 302. Further, the interface oxide layer 313 may also be used as an interface layer to prevent the possible lattice dislocations caused by the direct contact between the fins 301 and the subsequently formed high-K dielectric layer.

The interface oxide layer 313 may be made of any appropriate oxide material, such as silicon oxide, etc. Various processes may be used to form the interface oxide layer 313, such as a CVD process, a PVD process, an FCVD process, or a thermal oxidation process, etc.

In certain other embodiments, a high-K dielectric layer (not shown) may be formed on the interface oxide layer 313 after forming the interface oxide layer 313; and then the dummy gates 302 may be formed on the high-K dielectric layer. In certain other embodiments, the high-K dielectric layer may be formed after forming trenches by removing the dummy gates 302. Thus, it may prevent the high-K dielectric layer from being damaged by the subsequent process for removing the dummy gates 302.

FIG. 4 illustrates a cross-section view of the semiconductor structure shown in FIG. 2 along the "CD" direction. Referring to FIG. 4, a portion of the dummy gates 302 between adjacent fins 301 may be formed on the insulation layer 312 formed on the semiconductor substrate 300. For illustrative purposes, the following structures and processes are described along the "CD" direction illustrated in FIG. 2.

Figure 5:
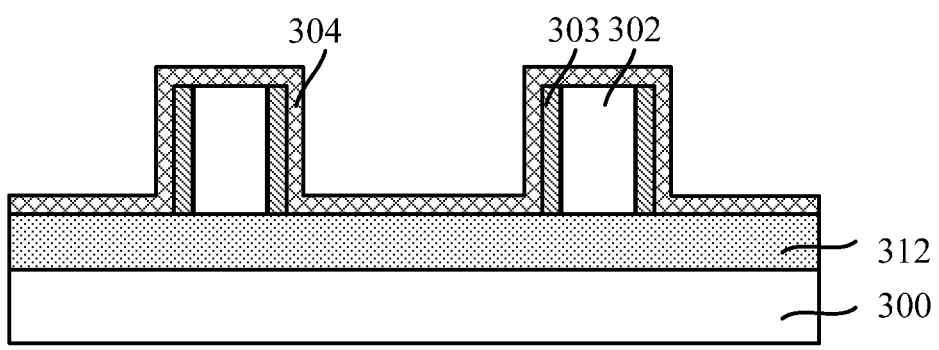

Returning to FIG. 18, after providing the semiconductor substrate 300 having the fins 301 and the dummy gates 302, sidewalls and a contact etching stop layer (CESL) may be formed (S102). FIG. 5 illustrates a corresponding semiconductor structure.

As shown in FIG. 5, sidewalls 303 are formed on the side surfaces of the dummy gates 302. Further, a CESL 304 is formed. The CESL 304 may cover the surfaces of the dummy gates 302, the sidewalls 303 and the fins 301 (not shown).

A process for forming the sidewalls 303 may include forming a sidewall material layer on the side and top surfaces of the dummy gates 302, the surface of the insulation layer 312 and a portion of the surfaces of the fins 301; and followed by an etch back process. Thus, the sidewalls 303 may be formed on the side surfaces of the dummy gates 302.

The sidewalls 303 may be a single layer structure, or a multiple-stacked structure. The sidewall material layer may be made of any appropriate material, such as one or more of SiN, SiON, SiC, SiOCN, or SiOBN, etc. The thickness of the sidewalls 303 may be in a range of approximately 10 Å~100 Å. Various processes may be used to form the sidewall material layer, such as a CVD process, a PVD process, an FCVD process, or an ALD process, etc.

Further, after forming the sidewalls 303, an ion implantation process may be performed onto the fins 301 at both sides of the dummy gates 302 and the sidewalls 303 using the sidewalls 303 and the dummy gates 302 as a mask. Thus, source/drain regions (not shown) may be formed in the fins 301 at both sides of the dummy gates 302 and the sidewalls 303.

The ion type of the ion implantation process may be selected according to the type of the FinFETs. Specifically, when the FinFETs are N-type FinFETs, the doping ions may be N-type ions. The N-type ions may be one or more of phosphorus ions, arsenic ions, or antimony ions, etc. When the FinFETs are P-type FinFETs, the doping ions may be P-type ions. The P-type ions may be one or more of boron ions, gallium ions, or indium ions, etc.

In certain other embodiments, the source/drain regions may be embedded source/drain regions. A process for forming the embedded source/drain regions may include forming trenches in the fins 301 at both sides of the dummy gates 302 and the sidewalls 303. The trenches may be formed by etching the fins 301 at both sides of the dummy gates 302 and the sidewalls 303 using the dummy gates 302 and the sidewalls 303 as an etching mask. After forming the trenches, the trenches may be filled with a stress material layer. Thus, the embedded source/drain regions may be formed.

Further, after forming the source/drain regions, the CESL 304 may be formed. The CESL 304 may be used as a stop layer for subsequent etching processes and/or polishing processes.

The CESL 304 may be made of any appropriate material, such as one or more of SiN, SiON, SiC, SiOCN, or SiOBN, etc. The thickness of the CESL 304 may be in a range of approximately 10 Å~150 Å. Various processes may be used to form the CESL 304, such as a CVD process, a PVD process, an ALD process, or an FCVD process, etc.

Figure 6:
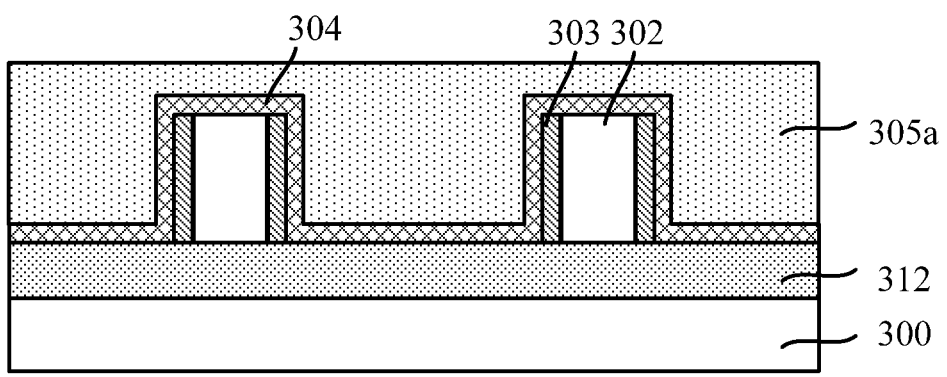

Returning to FIG. 18, after forming the CESL 304, a precursor material layer may be formed (S103). FIG. 6 illustrates a corresponding semiconductor structure.

As shown in FIG. 6, a precursor material layer 305a is formed on the CSEL 304. The precursor material layer 305a may cover the dummy gates 302 and the semiconductor substrate 300; and the top surface of the precursor material layer 305a may be higher than the top surfaces of the fins 301. The precursor material layer 305a may be used to subsequently form a dielectric layer.

Various processes may be used to form the precursor material layer 305a, such as a CVD process, a PVD process, an ALD process, or an FCVD process, etc. In one embodiment, the precursor material layer 305a is formed by an FCVD process. The precursor material layer 305a formed by the FCVD process may have a significantly high gap filling ability and step covering ability with respect to the special structures of the FinFETs. Thus, the possible void defects formed in the precursor material layer 305a may be prevented.

The precursor material layer 305a may be made of any appropriate material. In one embodiment, the precursor material layer 305 may contain Si. The precursor material layer 305a may also contain one or more of H, and N, etc.

The precursor of the FCVD process for forming the precursor material layer 305a may include one or more of $SiH_4$, $Si_2H_4$, $SiCH_6$, $SiC_2H_8$, $SiC_3H_{10}$, $SiC_4H_{12}$, $Si(OC_2H_5)_4$, $C_6H_{16}O_3Si$, $C_8H_{24}O_4Si_4$, $(CH_3)_2SiHOSiH(CH_3)_2$, $C_{12}H_{24}O_4Si_4$, $C_{12}H_{31}NO_6Si_2$, or $C_5H_{15}NSi$, etc. The flow rate of the precursor may be in a range of approximately 150 sccm~1000 sccm. The pressure of the reaction chamber of the FCVD process may be in a range of approximately 0.15 Torr~5 Torr. The temperature of the reaction chamber may be in a range of approximately 20° C.~150° C.

The precursor material layer 305a formed by the FCVD process may include Si—H bonds, Si—N bonds or Si—N—H bonds, etc. Such chemical bonds may be converted into a dielectric material layer by a subsequent thermal annealing process.

Figure 7:
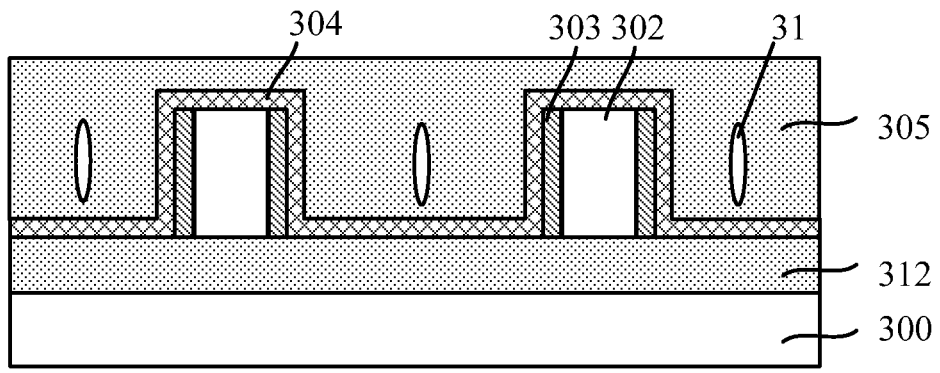

Returning to FIG. 18, after forming the precursor material layer 305a, a dielectric layer may be formed by a thermal annealing process (S104). FIG. 7 illustrates a corresponding semiconductor structure.

As shown in FIG. 7, a dielectric layer 305 is formed. The dielectric layer 305 may be formed by performing a thermal annealing process on the precursor material layer 305a; and the precursor material layer 305a may be converted into the dielectric layer 305. Voids 31 may be formed in the dielectric layer 305 during the conversion process. In certain other embodiments, the dielectric layer 305 may be referred as an interlayer dielectric layer 305.

The thermal annealing process may be any appropriate processes. In one embodiment, the thermal annealing process is a low temperature water steam thermal annealing process. If the annealing temperature is significantly high, the doping ions in the source/drain regions of the FinFETs may over-diffuse. Thus, the performance of the FinFETs may be affected. Therefore, the temperature of the low temperature water steam thermal annealing process may be in a range of approximately 200° C.~600° C. The pressure of the chamber of the low temperature water steam thermal annealing process may be in a range of approximately 1 Torr~200 Torr.

When the low temperature water steam thermal annealing process is being performed, the Si—H bonds, Si—N bonds, and/or Si—N—H bonds of the precursor material layer 305a may be broken; and the oxygen element of the water steam may enter into the precursor material layer 305a. Thus, Si—O bonds may be formed by the reaction between the oxygen element and the silicon element in the precursor material layer 305a. During the early stage of the low temperature water steam thermal annealing process, the quantity of oxygen on the surface of the precursor material layer 305a may be relatively large. Thus, the conversion rate of the precursor material layer 305a to the dielectric layer 305 on the surface of the precursor material layer 305a may be greater than the conversion rate of the precursor material layer 305a to the dielectric layer 305 on the bottom of the precursor material layer 305a.

During the late stage of the low temperature water steam thermal annealing process, the surface of the precursor material layer 305a may have been converted into the material of the dielectric layer 305, the density of the material of the dielectric layer 305 may be relatively large. Thus, the portion of the dielectric layer 305 formed on the top portion of the precursor material layer 305a may prevent the oxygen in the water steam from entering into the bottom of the precursor material layer 305a. Therefore, the conversion rate of the precursor material layer 305a to the dielectric layer 305 may be reduced, or the bottom of the precursor material layer 305a may not be converted into the dielectric layer 305.

With respect to the special structure of the FinFETs, the distance between adjacent dummy gates 302 may be substantially small; and the depth-to-width ratio of the trench between the adjacent dummy gates 302 may be significantly large. Further, the portion of the dielectric layer 305 formed on the top portion of the precursor material layer 305a during the early stage of the low temperature water steam thermal annealing process may prevent the oxygen in the water steam from entering into the bottom of the precursor material layer 305a. Thus, it may be more difficult for the water steam to enter into the bottom of the precursor material layer 305a. Therefore, the bottom of the precursor material layer 305a may be unable to entirely convert into the material of the dielectric layer 305. The unconverted portion of the precursor material layer 305a may be significantly loose; and may have a plurality of the voids. Thus, the voids 31 may be formed in the dielectric layer 305. Such voids 31 in the dielectric layer 305 may significantly affect the electrical insulation property of the dielectric layer 305.

After the low temperature water steam thermal annealing process, the precursor material layer 305a may be converted to form the dielectric layer 305. The dielectric layer 305 may be made of any appropriate material depending upon the material of the precursor material layer 305a. In one embodiment, the dielectric layer 305 is made of silicon oxide.

Figure 8:
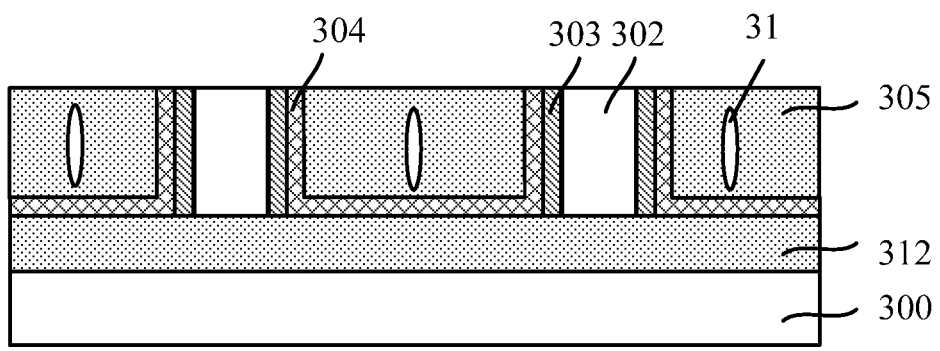

Returning to FIG. 18, after forming the dielectric layer 305, a planarization process may be performed (S105). FIG. 8 illustrates a corresponding semiconductor structure.

As shown in FIG. 8, the dielectric layer 305 is planarized; and the top portion of the dielectric layer 305 is removed by the planarization process. The planarization process may be performed until the top surfaces of the dummy gates 302 are exposed.

The planarization process may be a chemical mechanical polishing (CMP) process, a physical mechanical polishing process, or an ion beam polishing process, etc. In one embodiment, a CMP process is used to planarize the dielectric layer 305 to expose the top surfaces of the dummy gates 302. The process for planarizing the dielectric layer 305 may include a first planarization step and a second planarization step. The first planarization step may use the CESL 304 as a stop layer. The second planarization step may use the top surfaces of the dummy gates 302 as a stop layer.

Figure 9:
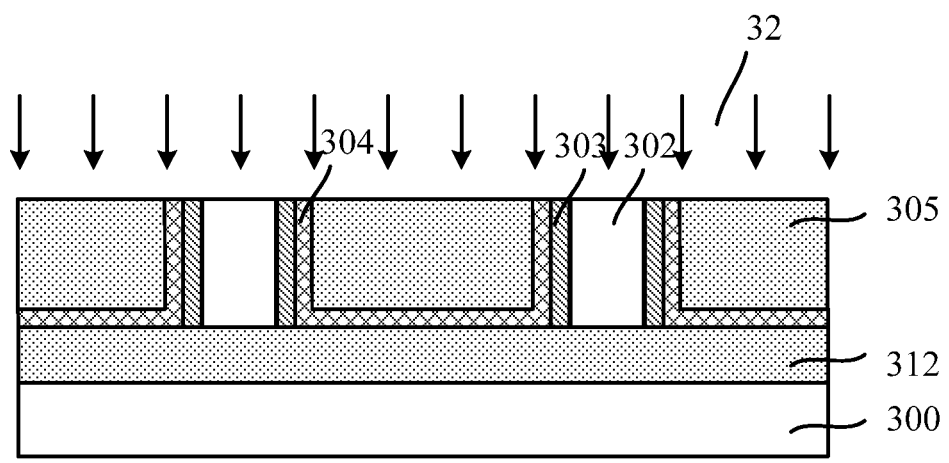

Returning to FIG. 18, after performing the planarization process, a post-treatment process may be performed to eliminate the voids 31 (S106). FIG. 9 illustrates a corresponding semiconductor structure.

As shown in FIG. 9, the voids 31 are removed by a post-treatment process. The post-treatment process may use a certain solution 32 to treat the polished dielectric layer 305 to remove the voids 31.

The solution 32 of the post-treatment process may include any appropriate chemicals. In one embodiment, the solution 32 of the post-treatment process is de-ionized (DI) water containing oxygen. For illustrative purposes, the solution 32 may be referred as oxygen-contained DI water. The oxygen ions and the hydrogen ions of the oxygen-contained DI water may diffuse into the polished dielectric layer 305. The oxygen ions and the hydrogen ions in oxygen-contained DI water 32 may react with the silicon element in the unconverted precursor material to form Si—O bonds and/or Si—O—H bonds. Thus, the unconverted precursor material in the dielectric layer 305 may be completely converted into the material of the dielectric layer 305; and the voids 31 in the dielectric layer 305 may be eliminated.

The oxygen source in the oxygen-contained DI water 32 of the post-treatment process may be any appropriate chemicals. In one embodiment, the oxygen source is ozone ions. The ozone ions may have a significantly high oxygen concentration, and a significantly high activity in the water solution. Further, it may be relative easy for ozone ions to diffuse from the surface of the dielectric layer 305 to the bottom of the dielectric layer 305. The mass percentile of the ozone ions in the oxygen-contained DI water 32 may be smaller than approximately 10%.

The post-treatment process performed on the planarized dielectric layer 305 using the oxygen-contained DI water 32 may be a soaking process. During the soaking process, the entire dielectric layer 305 may be covered by the oxygen-contained DI water 32. The oxygen ions and the hydrogen ions in the oxygen-contained DI water 32 may diffuse into the dielectric layer 305 from everywhere of the surface of the dielectric layer 305. Therefore, the voids 31 may be eliminated with a faster speed. The soaking time may be smaller than approximately 20 min. The soaking temperature may be in a range of approximately 50° C.~100° C. Under such a temperature, the activity of the oxygen ions and the hydrogen ions in the oxygen-contained DI water 32 may be improved; and the diffusion effect into the dielectric layer 305 may be as desired. Thus, the result and the efficiency of the elimination of the voids 31 in the dielectric layer 305 may be improved as well.

In one embodiment, the soaking process using the oxygen-contained DI water 32 may be performed after planarizing the dielectric layer 305. The thickness of the dielectric layer 305 may be reduced after the planarization process. Thus, the diffusion path of the oxygen ions and the hydrogen ions of the oxygen-contained DI water 32 in the dielectric layer 305 may be reduced; and more oxygen ions and hydrogen ions may rapidly reach the voids 31. Therefore, the results and the efficiency of the elimination of the voids 31 may be improved; and the soaking time may be reduced. After the soaking process, the semiconductor substrates 300 may be dried with any appropriate process.

Figure 10:
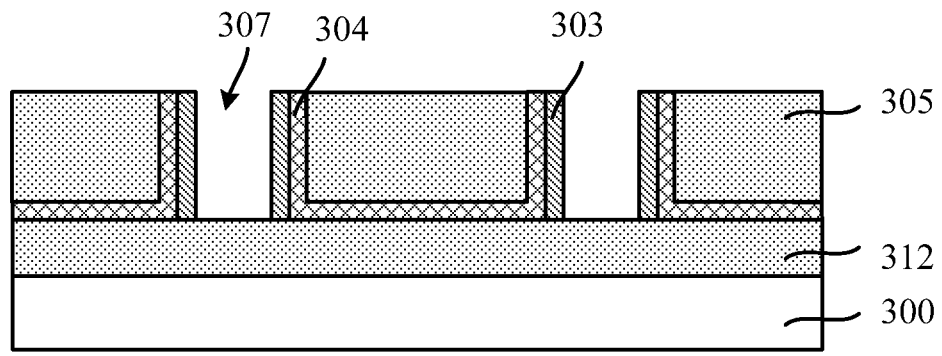

Returning to FIG. 18, after removing the voids 31, the dummy gate structures 302 may be removed; and trenches may be formed (S107). FIG. 10 illustrates a corresponding semiconductor structure.

As shown in FIG. 10, the dummy gates 302 are removed; and the trenches 307 are formed. Various processes may be used to remove the dummy gates 302, such as a dry etching process, or a wet etching process, etc. In one embodiment, the dummy gates 302 are removed by a wet etching process. The etching solution of the wet etching process may be a KOH solution, or a Tetra Methyl-Ammonium Hydroxide (TMAH) solution, etc.

Further, after removing the dummy gates 302, the interface oxide layer 313 (referring to FIG. 3) may be removed. In certain other embodiments, after removing the interface oxide layer 313, a liner oxide layer (not shown) may be formed on the surfaces of the fins 301.

Figure 11:
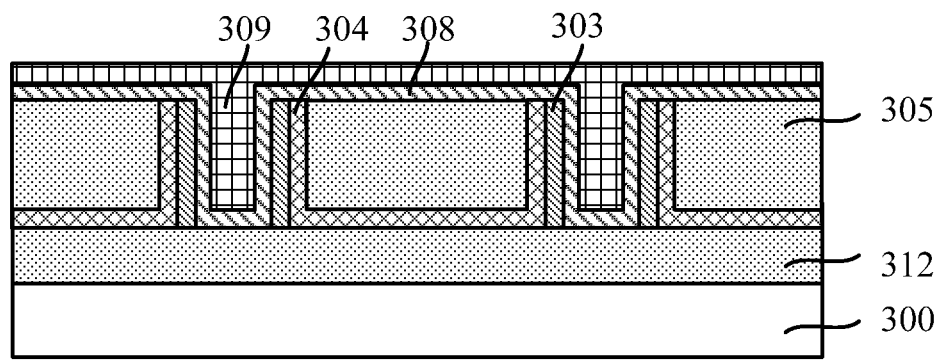
Figure 12:
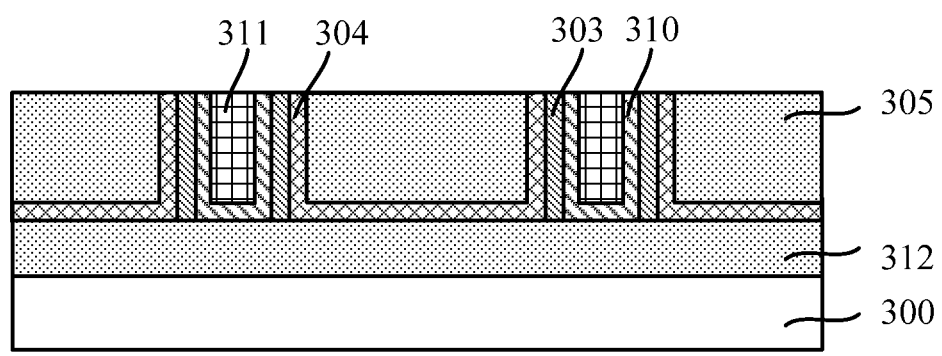
Figure 13:
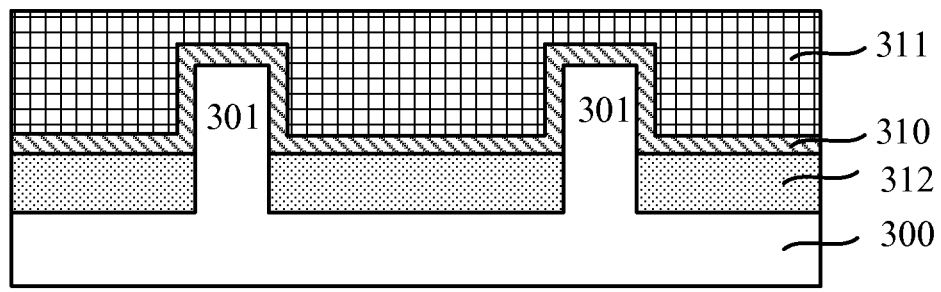

Returning to FIG. 18, after forming the trenches 307, high-K metal gate structures may be formed in the trenches 307 (S108). FIGS. 11~13 illustrate corresponding semiconductor structures. FIG. 12 illustrates the corresponding FinFETs shown in FIG. 2 along the "CD" direction; and the FIG. 13 illustrates the corresponding FinFETs shown in FIG. 2 along the "AB" direction.

As shown in FIGS. 12~13, a high-K metal gate (HKMG) structure (not labeled) is formed in each of the trenches 307. The HKMG structure may include a high-K gate dielectric layer 310 formed on the top surfaces and the side surfaces of fins 301 and a metal gate electrode 311 formed on the high-K gate dielectric layer 310. The high-K gate dielectric layer 310 may also cover the insulation layer 312.

As shown in FIGS. 11-13, a process for forming the HKMG structures in the trenches 307 may include forming a high-K dielectric material layer 308 on the surface of the insulation layer 312, the side and the top surfaces of the fins 301 and the surfaces of the sidewalls 303; forming a metal layer 309 on the high-K dielectric layer 308; and performing a planarization process on the high-K dielectric material layer 308 and the metal layer 309 until the top surface of the dielectric layer 305 is exposed. Thus, the high-K gate dielectric layer 310 may be formed on the side surfaces and the top surfaces of the fins 301; and the metal gate electrode 311 may be formed on the high-K gate dielectric layer 310. The high-K gate dielectric layer 310 and the metal gate electrode 311 may form an HKMG structure of the FinFET.

In one embodiment, the surface of the planarized dielectric layer 305 may have no defects, and the planarized dielectric layer 305 may be implanted with a certain type of solidifying ions. Thus, the surface density of the planarized dielectric layer 305 may be increased. Therefore, residues of the high-K material and the metal material may not be formed on the surface of the planarized dielectric layer 305 after planarizing the metal layer 309 and the high-K material layer 308 using the surface of the planarized dielectric layer 305 as a polishing stop layer.

The high-K material layer 308 may be made of any appropriate material, such as one or more of $HfO_2$, $TiO_2$, HfZrO, HfSiNO, $Ta_2O_5$, $ZrO_2$, $ZrSiO_2$, $Al_2O_3$, $SrTiO_3$, or $BaSrTiO$, etc. Various processes may be used to form the high-K material layer 308, such as a CVD process, a PVD process, or an FCVD process, etc.

The metal layer 309 may be made of any appropriate material, such as one more of W, Al, Cu, Ti, Ag, Au, Pt, or Ni, etc. Various processes may be used to form the metal layer 309, such as a CVD process, a PVD process, an FCVD process, or an electroplating process, etc.

In certain other embodiments, before forming the metal layer 309, a work function layer (not shown) may be formed on the high-K material layer 308. The work function layer may be used to adjust the work function of the FinFETs.

Thus, FinFETs may be formed by the above disclosed processes and methods; and the corresponding FinFETs are illustrated in FIGS. 12~13. As shown in FIGS. 12~13, the FinFETs include a semiconductor substrate 300; and a plurality of fins 301 formed on the semiconductor substrate 300. The FinFETs also include an insulation layer 312 with a top surface lower than the top surfaces of the fins 301 formed on the surface of the semiconductor substrate 300; and a high-K gate dielectric layer 310 stretching over the side surfaces and the top surfaces of the fins 301 formed on the insulation layer 312. Further, the FinFETs include a metal gate 311 formed on the high-K gate dielectric layer 310; and sidewalls 303 formed on the side surfaces of the high-K gate dielectric layer 310. Further, the FinFETs also include a contact etching stop layer 304 formed on the side surfaces of the sidewalls 303; and a planarized dielectric layer 305 treated by oxygen-contained DI water formed on the surface of the contact etching stop layer 304. The detailed structures and intermediate structures are described above with respect to the fabrication processes.

FIGS. 14~17 illustrate semiconductor structures corresponding to certain stages of another exemplary fabrication method of FinFETs consistent with the disclosed embodiments. For illustrative purposes, the illustrated views of the FinFETs are similar with the FinFETs illustrated in FIG. 2 along the "CD" direction.

Figure 14:
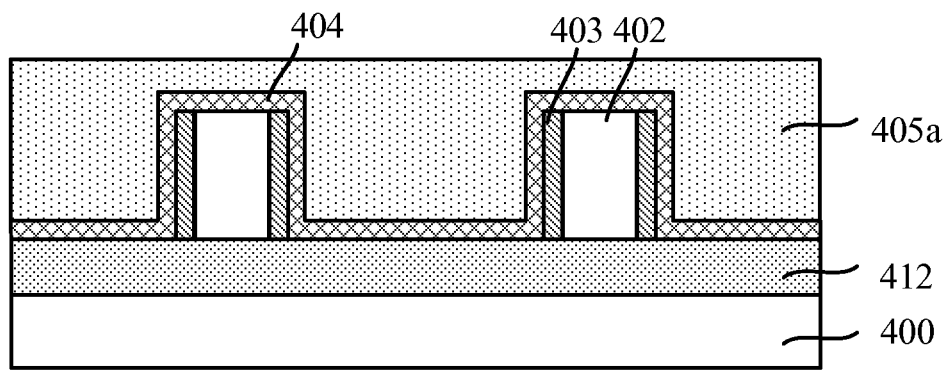
FIGS. 14~17 illustrate semiconductor structures corresponding to certain stages of another exemplary fabrication method of FinFETs consistent with the disclosed embodiments.

As shown in FIG. 14, at the beginning of the fabrication process, a semiconductor substrate 400 is provided; and a plurality of fins (not shown) are formed on the semiconductor substrate 400. Further, dummy gate structures 402 stretching over the side surfaces and the top surfaces of the fins are formed.

The semiconductor substrate 400 may include any appropriate semiconductor materials, such as silicon, silicon on insulator (SOI), silicon germanium, germanium on insulator (GOI), carborundum, indium antimonide, lead telluride, indium arsenide, indium phosphide, gallium arsenidie, gallium nitride, gallium antimonite, alloy semiconductor or a combination thereof. In one embodiment, the semiconductor substrate 400 is silicon. The semiconductor substrate 400 provides a base for subsequent processes and structures.

Further, an insulation layer 412 may be formed on the surface of the semiconductor substrate 400. The top surface of the insulation layer 412 may be lower than the top surface of the fins. The insulation layer 412 may be used to electrically insulate adjacent fins and adjacent subsequently formed gate structures.

The insulation layer 412 may be made of any appropriate material, such as silicon oxide, silicon nitride, or silicon oxynitride, etc. In one embodiment, the insulation layer 412 is made of silicon oxide.

A process for forming the insulation layer 412 may include sequentially forming an insulation material layer to cover the surface of the semiconductor substrate 400 and the fins; planarizing the insulation material layer by a chemical mechanical polishing (CMP) process using the top surface of the fins as a polishing stop layer; and performing an etch back process to further remove a portion of the insulation material layer to cause the polished surface to be lower than the top surfaces of the fins. Thus, the insulation layer 412 may be formed.

A plurality of the dummy gate structures 402 may be formed on each of the fins. Thus, a plurality of the metal gates may be subsequently formed on each of the fins. In one embodiment, the distance between adjacent dummy gate structures 402 may be in a range of approximately 20 nm~200 nm.

In one embodiment, a single dummy gate 402 may stretch over a plurality of the fins. In certain other embodiments, the dummy gate 402 may be broken in between different fins.

The dummy gates 402 may be made of any appropriate material, such as poly silicon, or metal material, etc. In one embodiment, the dummy gates 402 are made of polysilicon.

A process for forming the dummy gates 402 may include sequentially forming a polysilicon layer (not shown) to cover the fins and the insulation layer 412; planarizing the polysilicon layer by a CMP process; forming a patterned mask layer on the planarized polysilicon layer; and etching the planarized polysilicon layer using the patterned mask layer as an etching mask. Thus, the dummy gates 402 stretching over the side surfaces and the top surfaces of the fins may be formed.

The polysilicon layer may be formed by any appropriate process, such as a CVD process, a PVD process, an ALD process, or an FCVD process, etc. In one embodiment, the polysilicon layer is formed by a CVD process.

Further, after providing the semiconductor substrate 400 having the fins and the dummy gates 402, sidewalls 403 are formed on the side surfaces of the dummy gates 402; and a CESL 404 is formed to cover the top surfaces of the dummy gates 402, the sidewalls 403 and the fins (not shown).

A process for forming the sidewalls 403 may include forming a sidewall material layer on the side and top surfaces of the dummy gates 402, the surface of the insulation layer 412 and a portion of the surfaces of the fins; and followed by an etch back process. Thus, the sidewalls 403 may be formed on the side surfaces of the dummy gates 402.

The sidewalls 403 may be a single layer structure, or a multiple-stacked structure. The sidewall material layer may be made of any appropriate material, such as one or more of SiN, SiON, SiC, SiOCN, or SiOBN, etc. The thickness of the sidewalls 403 may be in a range of approximately 10 Å~100 Å. Various processes may be used to form the sidewall material layer, such as a CVD process, a PVD process, an FCVD process, or an ALD process, etc.

Further, after forming the sidewalls 403, an ion implantation process may be performed onto the fins at both sides of the dummy gates 402 and the sidewalls 403 using the sidewalls 403 and the dummy gates 402 as a mask. Thus, source/drain regions (not shown) may be formed in the fins at both sides of the dummy gates 402 and the sidewalls 403.

The ion type of the ion implantation process may be selected according to the type of the FinFETs. Specifically, when the FinFETs are N-type FinFETs, the doping ions may be N-type ions. The N-type ions may be one or more of phosphorus ions, arsenic ions, or antimony ions, etc. When FinFETs are P-type FinFETs, the doping ions may be P-type ions. The P-type ions may be one or more of boron ions, gallium ions, or indium ions, etc.

In certain other embodiments, the source/drain regions may be embedded source/drain regions. A process for forming the embedded source/drain regions may include forming trenches in the fins at both sides of the dummy gates 402 and the sidewalls 403. The trenches may be formed by etching the fins at both sides of the dummy gates 402 and the sidewalls 403 using the dummy gates 402 and the sidewalls 403 as an etching mask. After forming the trenches, the trenches may be filled with a stress material layer. Thus, the embedded source/drain regions may be formed.

Further, after forming the source/drain regions, the CESL 404 may be formed. The CESL 404 may be used as a stop layer for subsequent etching processes and/or polishing processes.

The CESL 404 may be made of any appropriate material, such as one or more of SiN, SiON, SiC, SiOCN, or SiOBN, etc. The thickness of the CESL 404 may be in a range of approximately 10 Å~150 Å. Various processes may be used to form the CESL 404, such as a CVD process, a PVD process, an ALD process, or an FCVD process, etc.

Further, after forming the CESL 404, a precursor material layer 405a may be formed on the CSEL 404. The precursor material layer 405a may cover the dummy gates 402 and the semiconductor substrate 400; and the top surface of the precursor material layer 405a may be higher than the top surfaces of the fins. The precursor material layer 405a may be used to subsequently form a dielectric layer.

Various processes may be used to form the precursor material layer 405a, such as a CVD process, a PVD process, an ALD process, or an FCVD process, etc. In one embodiment, the precursor material layer 405a is formed by an FCVD process. The precursor material layer 405a formed by the FCVD process may have a significantly high gap filling ability and step covering ability with respect to the special structure of the FinFETs. Thus, the possible void defects in the precursor material layer 405a may be prevented.

The precursor material layer 405a may be made of any appropriate material. In one embodiment, the precursor material layer 405a may contain Si. The precursor material layer 405a may also contain one or more of H and N, etc.

The precursor of the FCVD process for forming the precursor material layer 405a may include one or more of $SiH_4$, $Si_2H_4$, $SiCH_6$, $SiC_2H_8$, $SiC_3H_{10}$, $SiC_4H_{12}$, $Si(OC_2H_5)_4$, $C_6H_{16}O_3Si$, $C_8H_{24}O_4Si_4$, $(CH_3)_2SiHOSiH(CH_3)_2$, $C_{12}H_{24}O_4Si_4$, $C_{12}H_{31}NO_6Si_2$, or $C_5H_{15}NSi$, etc. The flow rate of the precursor may be in a range of approximately 150 sccm~1000 sccm. The pressure of the reaction chamber of the FCVD process may be in a range of approximately 0.15 Torr~5 Torr. The temperature of the reaction chamber may be in a range of approximately 20° C.~150° C.

The precursor material layer 405a formed by the FCVD process may include Si—H bonds, Si—N bonds or Si—N—H bonds. Such chemical bonds may be converted into a dielectric material layer by a subsequent thermal annealing process.

Figure 15:
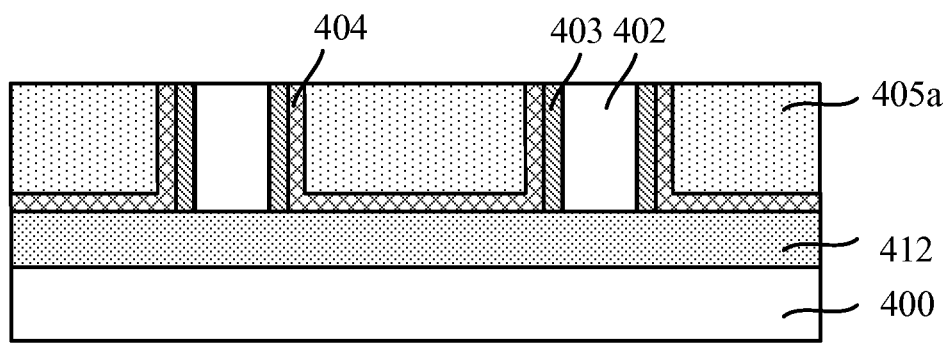

Further, as shown in FIG. 15, after forming the precursor material layer 405a, the precursor material layer 405a may be planarized; and the top portion of the precursor material layer 405a may be removed by the planarization process. The planarization process may be performed until the top surfaces of the dummy gates 402 are exposed.

The planarization process may be a chemical mechanical polishing (CMP) process, a physical mechanical polishing process, or an ion beam polishing process, etc. In one embodiment, a CMP process is used to planarize the precursor material layer 405a to expose the top surfaces of the dummy gates 402. The process for planarizing the precursor material layer 405a may include a first planarization step and a second planarization step. The first planarization step may use the CESL 404 as a stop layer. The second planarization step may use the top surfaces of the dummy gates 402 as a stop layer.

Figure 16:
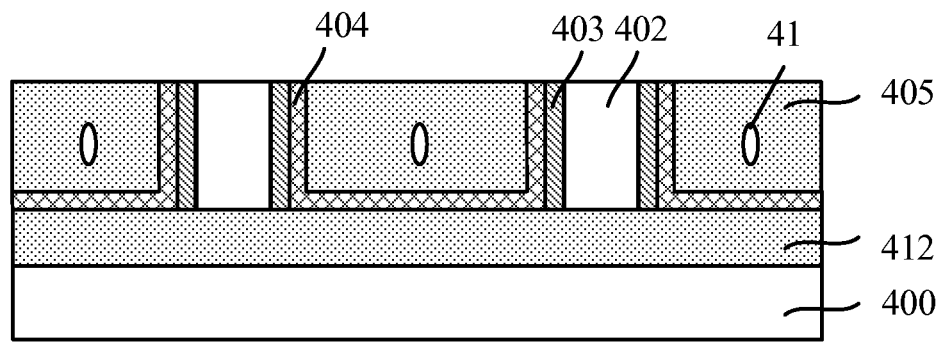

Further, as shown in FIG. 16, after planarizing the precursor material layer 405a, a dielectric layer 405 is formed. The dielectric layer 405 may be formed by performing a thermal annealing process on the planarized precursor material layer 405a. Thus, the planarized precursor material layer 405a may be converted into the dielectric layer 405. Further, possible voids 41 may be formed in the dielectric layer 405 during the conversion process.

The thermal annealing process may be any appropriate processes. In one embodiment, the thermal annealing process is a low temperature water steam thermal annealing process. If the annealing temperature is significantly high, the doping ions in the source/drain regions of the FinFETs may overly diffuse. Thus, the performance of the FinFETs may be affected. Therefore, the temperature of the low temperature water steam thermal annealing process may be in a range of approximately 200° C.~600° C. The pressure of the chamber of the low temperature water steam thermal annealing process may be in a range of approximately 1 Torr~200 Torr.

When the low temperature water steam thermal annealing process is being performed, the Si—H bonds, Si—N bonds, and or Si—N—H bonds of the polished precursor material layer 405a may be broken; and the oxygen element of the water steam may enter into the polished precursor material layer 405a. Thus, Si—O bonds may be formed by the reaction between the oxygen element and the silicon element in the planarized precursor material layer 405a. During the early stage of the low temperature water steam thermal annealing process, the amount of oxygen on the surface of the planarized precursor material layer 405a may be relatively large. Thus, the conversion rate of the planarized precursor material layer 405a to the dielectric layer 405 on the surface of the planarized precursor material layer 405a may be greater than the conversion rate of the planarized precursor material layer 405a to the dielectric layer 405 on the bottom of the planarized precursor material layer 405a. During the late stage of the low temperature water steam thermal annealing process, the surface of the planarized precursor material layer 405a may have been converted into the material of the dielectric layer 405, the density of the material of the dielectric layer 405 may be relatively large. Thus, the portion of the dielectric layer 405 formed on the top portion of the planarized precursor material layer 405a may prevent the oxygen in the water steam from entering into the bottom of the planarized precursor material layer 405a. Therefore, the conversion rate of the planarized precursor material layer 405a to the dielectric layer 405 may be further reduced, or the bottom of the planarized precursor material layer 405a may not be converted into the dielectric layer 405.

With respect to the special structure of the FinFETs, the distance between adjacent dummy gates 402 may be substantially small; and the depth-to-width ratio of the trench between the adjacent dummy gates 402 may be significantly large. Further, the portion of the dielectric layer 405 formed on the top portion of the planarized precursor material layer 405a during the early stage of the low temperature water steam thermal annealing process may prevent the oxygen in the water steam from entering into the bottom of the planarized precursor material layer 405a. Thus, it may be more difficult for the water steam to enter into the bottom of the planarized precursor material layer 405a. Therefore, the bottom of the precursor material layer 405a may be unable to entirely convert into the material of the dielectric layer 405. The unconverted portion of the planarized precursor material layer 405a may be significantly loose; and may have a plurality of the voids. Thus, the possible voids 41 may be formed in the dielectric layer 405. Such voids 41 in the dielectric layer 405 may significantly affect the electrical insulation property of the dielectric layer 405.

After the low temperature water steam thermal annealing process, the planarized precursor material layer 405a may be converted to form the dielectric layer 405. The dielectric layer 405 may be made of any appropriate material depending upon the material of the precursor material layer 405a. In one embodiment, the dielectric layer 405 is made of silicon oxide.

In this embodiment, the precursor material layer 405a may be planarized before performing the low temperature water steam thermal annealing process to expose the surfaces of the dummy gates 402. The thickness of the precursor material layer 405a may be reduced after the planarization process. Thus, it may be easy for the by-products of the conversion between the precursor material and the dielectric material to discharge out the dielectric layer 405. Therefore, comparing the method which performs the water steam thermal annealing process before the CMP process, the formation of the voids 41 in the dielectric layer 405 may be prevented.

In one embodiment, there may be no voids formed in the dielectric layer 405 after the water steam thermal annealing process because of the reduced thickness of precursor material layer, but a test process may need to ensure the quality the dielectric layer 405a. However, the test may be time consuming and may be destructive. In certain other embodiments, the number of the voids 41 formed in the dielectric layer 405 may be substantially small because the reduced thickness of the precursor material layer 405a. Considering such two possibilities, a post-treatment process may be necessary to obtain a void free dielectric layer 405.

Figure 17:
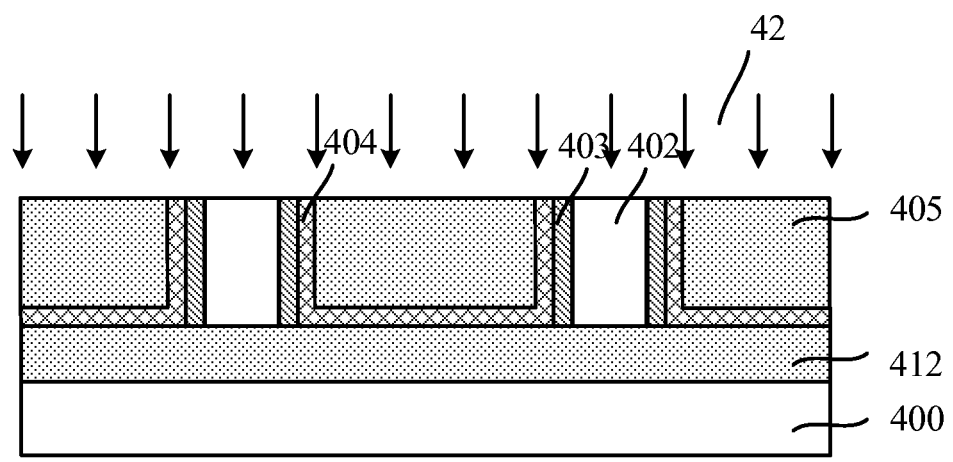

Therefore, as shown in FIG. 17, after forming the dielectric layer 405, a post-treatment process may be performed on the dielectric layer 405 in order to eliminate the possible voids 41. The post-treatment process may use a certain solution 42 to treat the dielectric layer 405 to remove the voids 41.

The solution 42 of the post-treatment process may include any appropriate chemicals. In one embodiment, the solution 42 of the post-treatment process is de-ionized (DI) water containing oxygen. For illustrative purposes, the solution 42 may be referred as oxygen-contained DI water 42. The oxygen ions and the hydrogen ions of the oxygen-contained DI water 42 may diffuse into the dielectric layer 405; and the oxygen ions and the hydrogen ions in oxygen-contained DI water 42 may react with silicon element in the unconverted precursor material to form Si—O bonds and/or Si—O—H bonds. The unconverted precursor material in the dielectric layer 405 may be completely converted into the material of the dielectric layer 405. Thus, the possible voids 41 formed in the dielectric layer 405 may be eliminated.

The oxygen source in the oxygen-contained DI water 42 of the post-treatment process may be from any appropriate chemicals. In one embodiment, the oxygen source is ozone ions. The ozone ions may have a significantly high oxygen concentration; and a significantly high activity in the water solution. Further, it may be relatively easy for the ozone ions to diffuse from the surface of the dielectric layer 405 to the bottom of the dielectric layer 405. The mass percentile of the ozone ions in the oxygen-contained DI water 42 may be smaller than approximately 10%.

The post-treatment process performed on the dielectric layer 405 using the oxygen-contained DI water 42 may be a soaking process. During the soaking process, the entire dielectric layer 405 may be covered by the oxygen-contained DI water 42. The oxygen ions and the hydrogen ions in oxygen-contained DI water 42 may diffuse into the dielectric layer 405 from everywhere of the surface of the dielectric layer 405. Therefore, the voids 41 may be eliminated with a faster rate. The soaking time may be smaller than approximately 20 mins. The soaking temperature may be in a range of approximately 50° C.~100° C. Under such a temperature, the activity of the oxygen ions and the hydrogen ions in the oxygen-contained DI water 42 may be improved; and the diffusion effect into the dielectric layer 405 may be as desired. Thus, the result and the efficiency of the elimination of the voids 42 in the dielectric layer 405 may be improved as well.

Further, after performing the post-treatment process, the dummy gates 402 may be removed to form trenches; and HKMG structures may be formed in the trenches.

According to the disclosed methods and structures, the possible voids formed in the dielectric layer may be eliminated by performing a post-treatment process using the oxygen-contained DI water. The oxygen ions and the hydrogen ions of the oxygen-contained DI water may diffuse into the unconverted precursor material layer; and react with silicon element to eliminate the possible voids. Further, the precursor material layer may be polished prior to the water steam thermal annealing process to reduce the thickness of the precursor material layer. Thus, comparing with the process that polishes the dielectric layer after the water steam thermal annealing process, the possible voids in the dielectric layer may be avoided. Therefore, the quality of the dielectric layer may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating fin-field effect transistors, comprising:
    providing a semiconductor substrate;
    forming a plurality of fins on a surface of the semiconductor substrate;
    forming dummy gates over side and top surfaces of the fins;
    forming a precursor material layer to cover the dummy gates and the semiconductor substrate;
    performing a thermal annealing process on the precursor material layer to convert the precursor material layer into a dielectric layer having a plurality of voids;
    planarizing the dielectric layer with the plurality of voids to expose top surfaces of the dummy gates;
    performing a post-treatment process using oxygen-contained de-ionized water onto the planarized dielectric layer to eliminate the plurality of voids formed in the dielectric layer;
    removing the dummy gates to form trenches in the dielectric layer without voids; and
    forming a high-K metal gate structure in each of the trenches.

2. The method according to claim 1, wherein:
    the dielectric layer is of silicon oxide.

3. The method according to claim 2, wherein:
    the precursor material layer contains silicon element and one or more of hydrogen element and nitrogen element.

4. The method according to claim 3, wherein:
    the precursor material layer is formed by a flowable chemical vapor deposition process;
    a precursor of the flowable chemical vapor deposition process includes one or more of $SiH_4$, $Si_2H_4$, $SiCH_6$, $SiC_2H_8$, $SiC_3H_{10}$, $SiC_4H_{12}$, $Si(OC_2H_5)_4$, $C_6H_{16}O_3Si$, $C_8H_{24}O_4Si_4$, $(CH_3)_2SiHOSiH(CH_3)_2$, $C_{12}H_{24}O_4Si_4$, $C_{12}H_{31}NO_6Si_2$, and $C_5Hi_5NSi$;
    a flow rate of the precursor is in a range of approximately 150 sccm~1000 sccm;
    a pressure of a reaction chamber of the flowable chemical vapor deposition process is in a range of approximately 0.15 Torr~5 Torr; and
    a temperature of the reaction chamber is in a range of approximately 20° C.~150° C.

5. The method according to claim 4, wherein:
    the thermal annealing process is a low temperature water steam thermal annealing process;
    a temperature of the low temperature water steam thermal annealing process is in a range of approximately 200° C.~600° C.; and
    a pressure of a chamber of the low temperature water steam thermal annealing process is in a range of approximately 1 Torr~200 Torr.

6. The method according to claim 4, wherein:
    an oxygen source of the oxygen-contained de-ionized water are ozone ions.

7. The method according to claim 6, wherein:
    a mass percentile of the ozone ions in the oxygen-contained de-ionized water is less than approximately 10%.

8. The method according to claim 6, wherein:
    the post-treatment process is a soaking process;
    a soaking time is less than approximately 20 mins; and
    a soaking temperature is in a range of approximately 50° C.~100° C.

9. The method according to claim 1, wherein:
    sidewalls are formed on side and top surfaces of the dummy gates; and
    a contact etching stop layer is formed on the sidewalls and the dummy gates.

10. The method according to claim 9, wherein:
    the contact etching stop layer is made of one or more of SiN, SiON, SiC, SiOCN, and SiOBN; and
    a thickness of the contact etching stop layer is in a range of approximately 10 Å~150 Å.

11. The method according to claim 9, wherein:
    the sidewalls are made of one or more of SiN, SiON, SiC, SiOCN, and SiOBN; and
    a thickness of the sidewalls is in a range of approximately 10 Å~100 Å.

12. The method according to claim 1, wherein:
    the dummy gates are made of polysilicon.

13. The method according to claim 12, wherein:
the dummy gates are removed by a wet etching process; and
an etching solution of the wet etching process is one of a KOH solution and Tetra Methyl-Amonium Hydroxide (TMAH) solution.

14. The method according to claim 1, wherein forming the fins and the dummy gates further includes:
etching the semiconductor substrate to form the plurality of fins;
forming an insulation material layer to cover the fins and the semiconductor substrate;
planarizing the insulation material layer using the top surfaces of the fins as a stop layer;
performing an etch back process to cause a top surface of the remaining insulation material layer to be lower than the top surfaces of the fins to form insulation layers between adjacent fins; and
forming the dummy gates on the top and side surfaces of the fins and a portion of surfaces of the insulation layer.

15. The method according to claim 1, after forming the precursor material layer, further including:
planarizing the precursor material layer to expose the dummy gate structures so as to reduce a thickness of the precursor material layer; and
performing a water steam thermal annealing process on the planarized precursor material layer.

* * * * *